US007868676B2

(12) United States Patent
Koh et al.

(10) Patent No.: US 7,868,676 B2
(45) **Date of Patent: *Jan. 11, 2011**

(54) HYBRID ON-CHIP REGULATOR FOR LIMITED OUTPUT HIGH VOLTAGE

(75) Inventors: Yun-Hak Koh, San Ramon, CA (US); Charles Qingle Wu, Palo Alto, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/860,449

(22) Filed: Aug. 20, 2010

(65) Prior Publication Data

US 2010/0315053 A1 Dec. 16, 2010

Related U.S. Application Data

(63) Continuation of application No. 12/014,712, filed on Jan. 15, 2008, now Pat. No. 7,804,345.

(51) Int. Cl.
*H03K 5/12* (2006.01)

(52) U.S. Cl. ........................ 327/170; 327/108; 327/112

(58) Field of Classification Search ......... 327/108–112, 327/170, 389, 391; 326/82, 83, 26, 27
See application file for complete search history.

(56) References Cited

U.S. PATENT DOCUMENTS 5,375,029 A 12/1994 Fukunaga et al.
5,596,297 A 1/1997 McClure et al.
6,150,800 A 11/2000 Kinoshita et al.
6,278,265 B1 8/2001 Yokosawa
7,046,036 B2 * 5/2006 Chen et al. .................... 326/56
7,132,820 B2 11/2006 Walters et al.
7,157,959 B2 1/2007 Ball et al.
7,266,351 B2 * 9/2007 Marholev .................. 455/130

(Continued)

FOREIGN PATENT DOCUMENTS

EP 0327881 A1 8/1989

OTHER PUBLICATIONS

PCT/US2008/087050, PCT International Search Report and Written Opinion of the International Searching Authority, mailed Mar. 24, 2009, 13 pages.

*Primary Examiner*—Long Nguyen
(74) *Attorney, Agent, or Firm*—Blakely Sokoloff Taylor & Zafman LLP

(57) ABSTRACT

A driver circuit includes a pre-driver and an output driver. The pre-driver is coupled to receive an input signal and to generate first and second pre-driver output signals in response to the input signal. The output driver generates a driver output signal and includes first and second switches, a native mode transistor, and a driver output. The first switch has a first control terminal coupled to receive the first pre-driver output signal. The second switch has a second control terminal coupled to receive the second pre-driver output signal. The native mode transistor is coupled in series between the first switch and the second switch and has a third control terminal coupled to receive the voltage reference signal. The driver output is coupled between the native mode transistor and the second switch to output the driver output signal.

19 Claims, 6 Drawing Sheets

U.S. PATENT DOCUMENTS

| | | | | |
|---|---|---|---|---|
| 7,400,127 | B2 | 7/2008 | Steele | |
| 7,804,345 | B2 * | 9/2010 | Koh et al. | 327/170 |
| 2004/0070910 | A1 | 4/2004 | Gergintschew | |
| 2007/0096708 | A1 | 5/2007 | Takeyama | |
| 2007/0170904 | A1 | 7/2007 | Hojo | |
| 2007/0182935 | A1 | 8/2007 | Miura | |

* cited by examiner

HYBRID ON-CHIP REGULATOR FOR LIMITED OUTPUT HIGH VOLTAGE

REFERENCE TO RELATED APPLICATIONS

This application is a continuation of U.S. application Ser. No. 12/014,712, filed Jan. 15, 2008.

TECHNICAL FIELD

This disclosure relates generally to regulators, and more particularly, but not exclusively, relates to hybrid regulators for integrated circuits.

BACKGROUND INFORMATION

In modern complementary metal oxide silicon (CMOS) technology, data output circuits are generally implemented by a push-pull drive circuit. Push-pull drive circuits include a pull-up device and a pull-down device. The pull-up device generally uses PMOSFET to drive an output terminal to a power supply voltage. The pull-down device generally uses NMOSFET to drive an output terminal to a ground voltage. However, when different voltage levels of power supplies are used to implement logic high voltage (VOH) between two separate chips, to have the same logic high voltage, it is necessary to limit output high voltage (VOH) from the higher power supply output drive circuit. This disclosure shows a circuit that limits output high voltage to a reference voltage level.

BRIEF DESCRIPTION OF THE DRAWINGS

Non-limiting and non-exhaustive embodiments of the disclosure are described with reference to the following figures, wherein like reference numerals refer to like parts throughout the various views unless otherwise specified.

DETAILED DESCRIPTION

Embodiments of a hybrid on-chip regulator for limited output high voltages are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In general, various high speed differential serial link standards have been designed to accommodate increased off-chip data rate communications. High speed USB, firewire (IEEE-1394), serial ATA and SCSI are a few of the standards used for serial data transmission in the PC industry. Low voltage differential signaling (LVDS) has also been implemented in transmission-side serial data communications.

Additionally, vendors (such as cellular phone companies) have proposed a "subLVDS" standard, which is a smaller voltage-swing variant of the LVDS standard. SubLVDS has been suggested for use in the Compact Camera Port 2 (CCP2) specification for serial communications between (for example) image sensors and onboard systems.

CCP2 is part of the Standard Mobile Imaging Architecture (SMIA) standard. Typical LVDS/subLVDS levels have an output common mode level (Vcm) between supply voltages VDD and VSS. For example, transmitters (Tx) for CCP2 normally have an output signal swing (Vod) of 150 mV with center voltage Vcm at 0.9V.

In addition to high speed data (such as image data), low speed chip control signals are often transmitted between host and client. Several new protocols have been developed for high speed ("HS") to low power ("LP") state changes using common mode levels. A joint effort among various cellular phone companies has defined a new physical layer (PHY) standard. The PHY standard defines the Mobile Industry Processor Interface (MIPI), which combines high speed image data transmission and low speed control signals in a single communication signal path ("lane").

Figure 1:
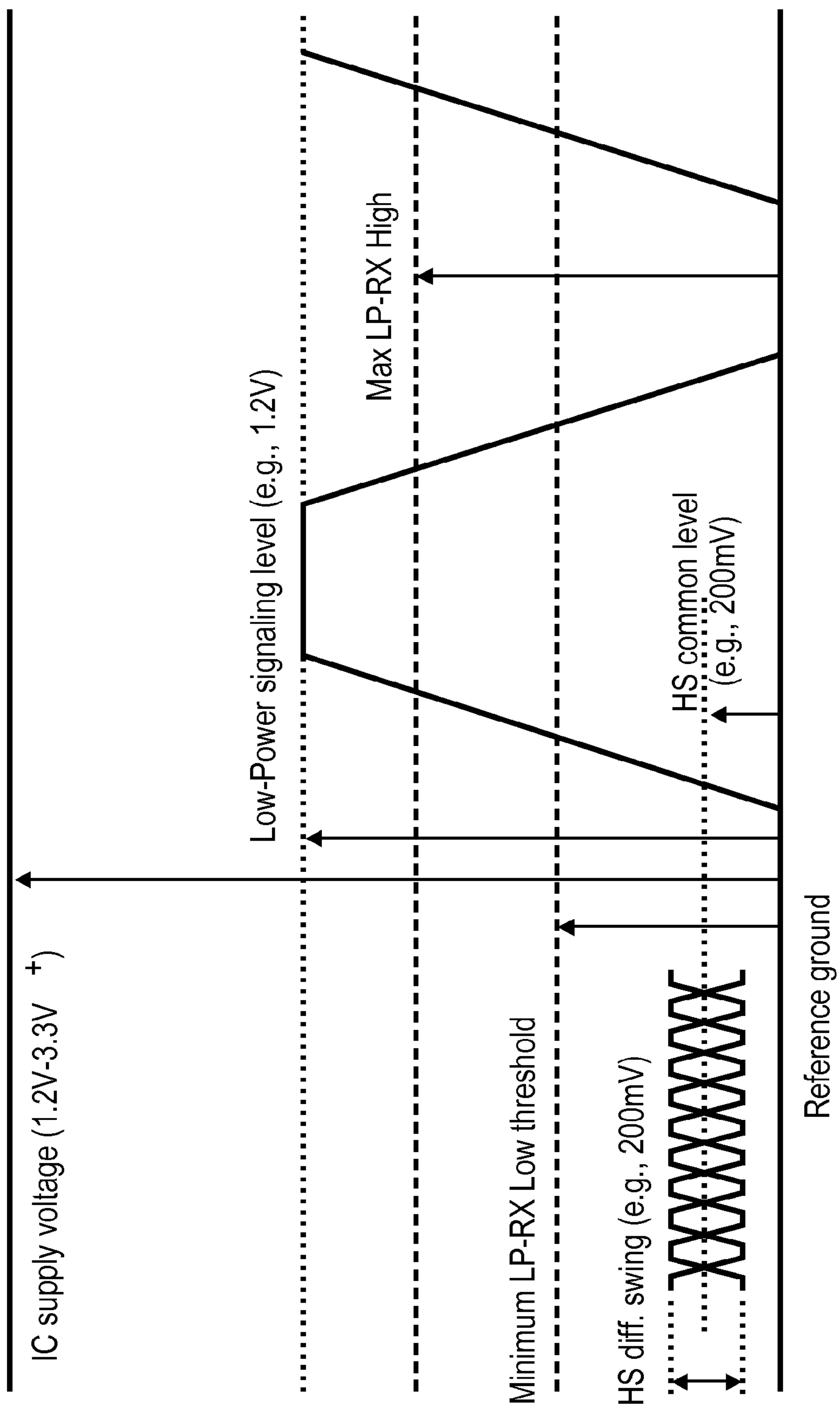
FIG. 1 is an illustration of sample MIPI PHY output line levels.

FIG. 1 is an illustration of sample MIPI PHY output line levels. A transmitter functions (such as a "lane state") can be programmed by driving the lane with certain line levels. For example, the high speed transmission (HS-TX) drives the lane differentially with a low common mode voltage level (Vcm: 0.2V) and small amplitude (Vod: 0.2V). In the HS-TX state, the logic high level (Voh: 0.3V) of HS-TX is relatively much lower than VDD.

During low speed transmission (LP-TX), the output signal normally toggles between 0V and 1.2V. To signal a transition from the HS-TX to the LP-TX state, an LP logic high is presented at the same time on both output pads (Dp and Dn) by toggling the Vcm from a low level of 0.2V to a high level of 1.2V. A receiver (coupled to the output of the transmitter) on the client side adjusts its receiving state from HS to LP in response to the asserted LP logic high presentation.

The MIPI standard specifies a high speed serial interface between components inside a mobile device. As discussed above, the MIPI standard low power signal specifies an output voltage swing of 1.2 volts having a relatively slow rise and fall time. The 1.2 volts of output high voltage is not normally the same as the power supply voltage provided by many semiconductor technologies. The low power driver typically has a separate 1.2 volt power supply, which is normally driven from a regulator output or from an output voltage limiting circuit.

Figure 2:
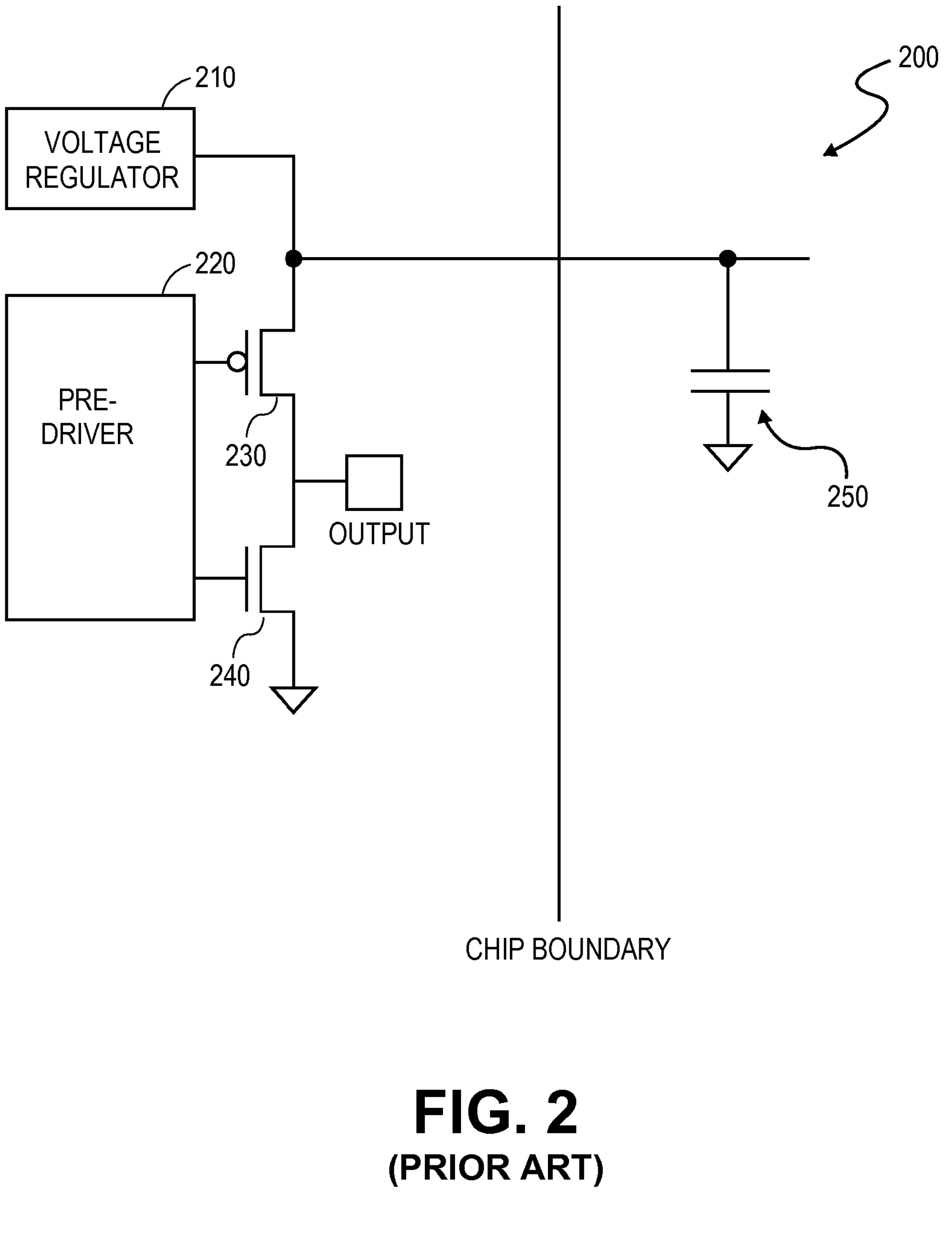
FIG. 2 (PRIOR ART)
FIG. 2 is an illustration of a driver circuit using a conventional voltage regulator.

The peak current of a low power driver can be over twenty milliamps because the low power driver typically drives high capacitive loads while it may power as many as six drivers working at the same time. When voltage regulators are used to provide a 1.2 volt power supply for a conventional push-pull CMOS low speed driver (as illustrated in FIG. 2 below), an external capacitor (having an example capacitance of 0.1 μF, for example) holds the Voh value and reduces the voltage ripple in the output voltage. Such an approach adds an extra I/O (input/output) pad, and cost, and increases components and space requirements of the system.

FIG. 2 is an illustration of a driver circuit using a conventional voltage regulator. Circuit 200 includes voltage regulator 210, pre-driver 220, PMOS transistor 230, NMOS transistor 240, and external capacitor 250. In operation, the power supply voltage for circuit 200 is generated by the voltage regulator 210, which limits the logic high level of the output signal. The output voltage of voltage regulator 210 is often used as the supply voltage for as many as eight push-pull CMOS output driver circuits. A push-pull CMOS output driver circuit can be formed by coupling transistor 230 with transistor 240 in series as shown in the Figure.

However, when the load current of the output driver circuit is relatively high, voltage regulator 210 normally requires, for example, a correspondingly larger capacitive value. An external capacitor is typically used because the capacitive value required by many applications is typically 0.1 μF or larger (which can be considered to be larger than a capacitive value that can be economically supplied by a structure in the integrated circuit).

The load current of the output can be defined using magnitude I and time T. The load current can be supplied by the voltage regulator 210 for providing a sufficient charge to keep the output voltage within specified limits. The amount of charge (Q) is the product of capacitance (C) and (V); thus: Q=IT=CV.

A regulator loop (which typically entails response times of greater than 100 ns) is typically used to maintain a voltage of the output when there is a change in the load current. The large capacitance of the external capacitor serves to (temporarily) reduce an output voltage change when the load current changes. When extra charge can be provided by the external capacitor, the cumulative voltage drop of the output voltage can be reduced considerably. When the length of time of the cumulative voltage drop is at least as long as the regulator loop response time, the voltage drop can be corrected by the regulator loop, which increases the regulator output voltage. Thus, at least a small voltage ripple in the regulator output is usually encountered because of the relatively long response time of the regulator loop.

When the external capacitor is not sufficiently large, the charge provided by the external capacitor does not substantially reduce the voltage drop over longer times. When the regulator loop corrects for the voltage drop, the regulator loop may overshoot the desired regulated voltage by reacting too strongly to the voltage drop. Likewise, the regulator loop may undershoot the desired regulated voltage by reacting to strongly to a voltage rise. The over (and under) shooting can cause ripple in the regulator output voltage.

A reference voltage can also be used to limit the output high voltage. When a reference voltage is applied to the gate of an NMOS transistor, an output high voltage is generated at a level that is an NMOS threshold (Vtn) below the reference voltage. The difference of the output high voltage and the reference voltage can be 0.4-0.8 volts, depending on the process technology, and thus is often unsuited for applications where the level of the output high voltage is specified to be close to the reference voltage. Additionally, the level of the output high voltage can vary over process corner conditions, supply voltage, differences and changes in operating temperatures when using a gate-coupled reference voltage without a feedback loop adjustment.

Figure 3:
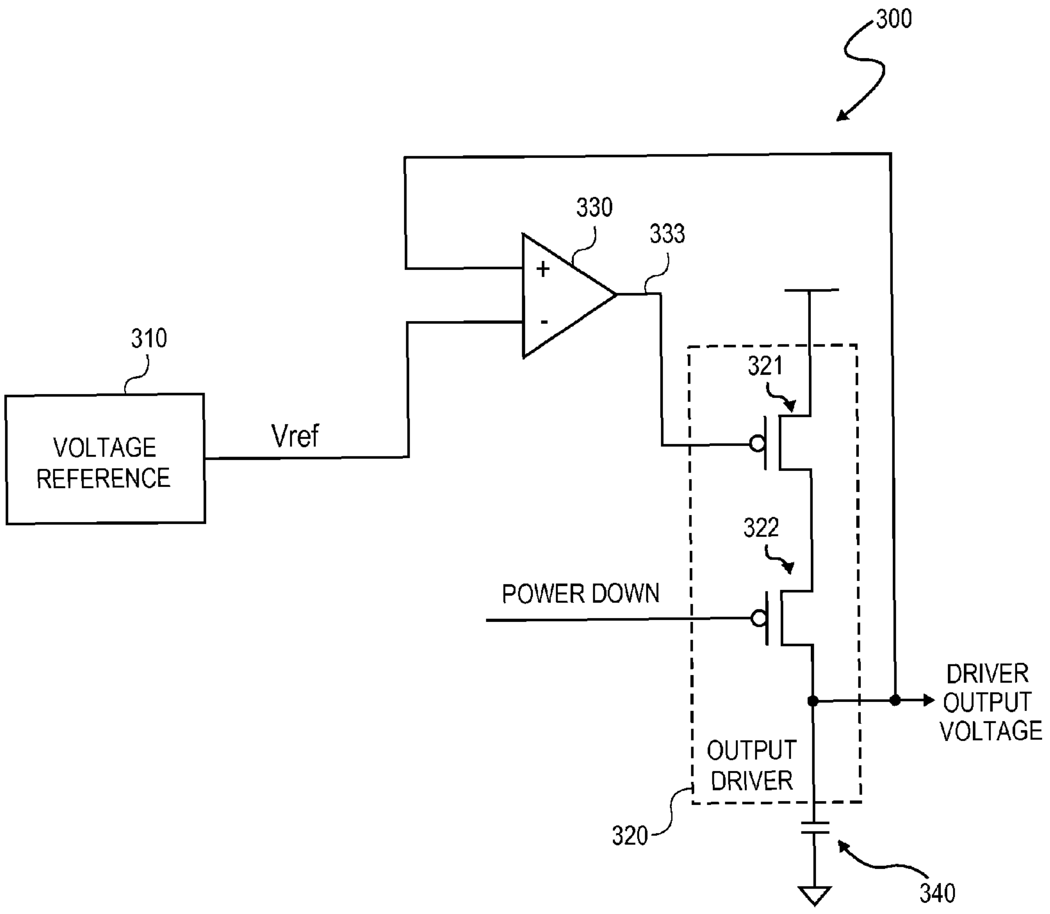
FIG. 3 is an illustration of a sample output voltage generation circuit.

FIG. 3 is an illustration of a sample output voltage generator. Output voltage generator 300 includes a voltage reference circuit 310, output driver 320, comparator 330, and an output capacitance represented by capacitor 340. Voltage reference circuit 310 can be programmable to select a desired voltage for clamping the output voltage. Output driver 320 includes switches 321 and 322. In an embodiment, switches 321 and 322 are PMOS transistors, where each transistor has a gate for the control terminal and a source and drain as non-control terminals.

The output of voltage reference circuit 310 is coupled to an inverting input of comparator 330. The output of output driver 320 is coupled to a non inverting input of comparator 330. The output of comparator 330 is coupled to a control terminal of switch 321 (in output driver 320). Switch 321 has a first non-control terminal coupled to a power supply and a second non-control terminal coupled to a first non-control terminal of switch 322. Switch 322 has a control terminal that is coupled to a power down signal. The second non-control terminal of switch 322 is coupled to a first terminal of the capacitor 340 (and to the non-inverting terminal of comparator 330). A second terminal of capacitor 340 is coupled to ground.

The voltage reference circuit of output voltage generator 300 is coupled to generate a voltage reference signal. A comparator is coupled to compare the voltage reference signal and a driver output voltage and in response to turn on and off the current path for the final driver output (not shown in this figure). An output voltage generator includes a first and a second switch that are coupled (for example, in series such that at least part of the current flowing through the first switch flows through the second switch). The first and second switches are further coupled to generate the driver output voltage in response to coupling the output high voltage control signal to the control terminal of the first switch.

In operation, output driver 300 uses the reference voltage signal to limit the output high voltage. The power down signal can be used to drive the gate of switch 322. When switch 321 is closed (conducting), the driver output signal is driven in response to the power down signal. In another embodiment, the power down signal conserves power when transmission is not needed.

The reference voltage signal is compared with the driver output voltage of output driver 320 so that an output high voltage control signal is generated. When the driver output signal reaches the reference voltage signal (when both switches 321 and 322 are closed), the output high voltage control signal turns off the current path of output driver 320 by opening switch 321. Capacitor 340 provides a large load capacitance that allows comparator 320 to respond quickly enough (with respect to the response time of the feedback path of comparator 330) to turn off the current path so that feedback path is stabilized. The load capacitance normally includes capacitive (parasitic or otherwise) structures in the transmission path of the output signal. Either (or both) switch 321 and 322 can be opened to conserve power for a power-down mode.

Figure 4:
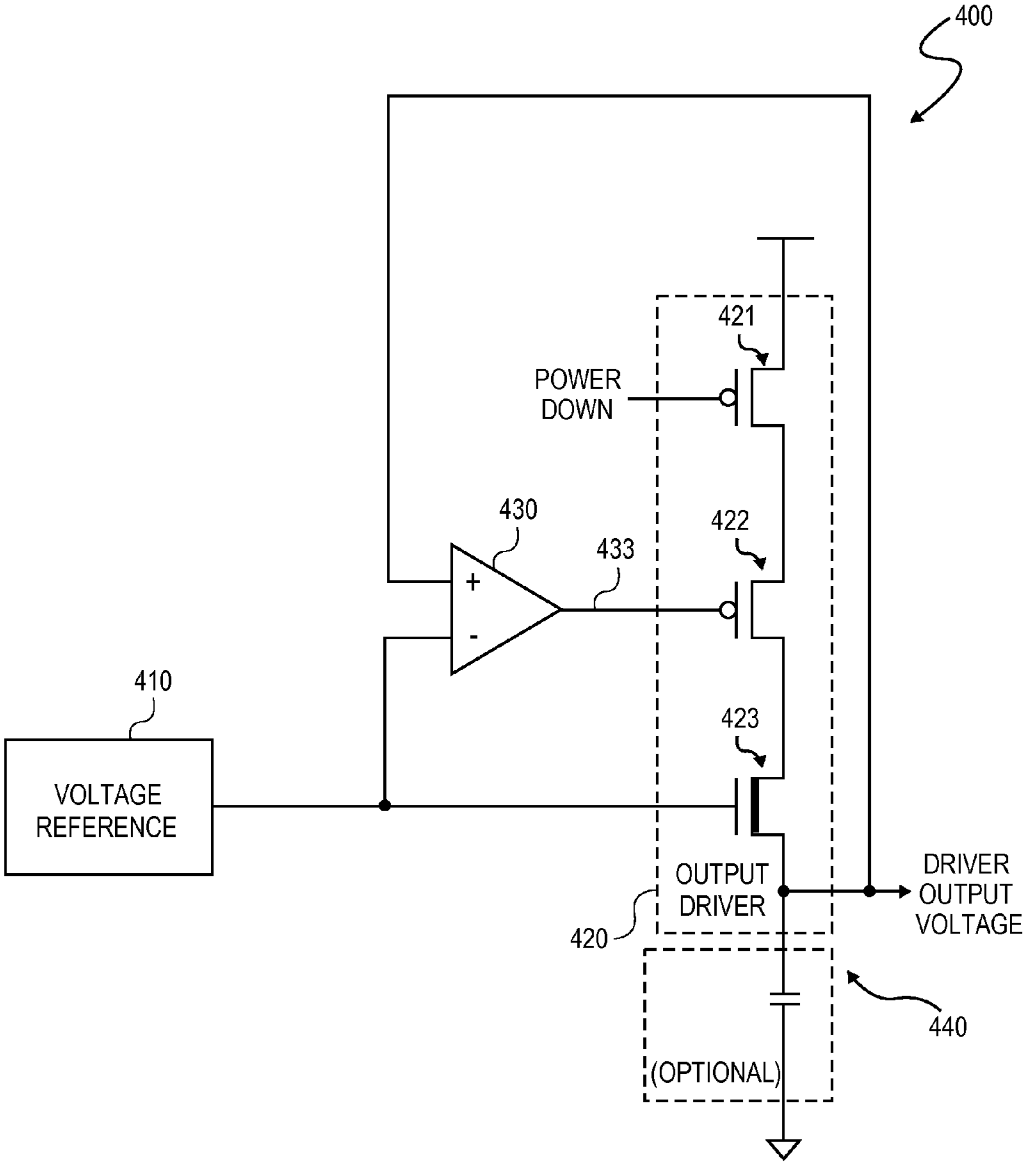
FIG. 4 is an illustration of a sample output voltage generation circuit having stabilization using a native NMOS/NMOS transistor.

FIG. 4 is an illustration of a sample output driver having stabilization using a native NMOS transistor. Output driver 400 includes a voltage reference circuit 410, output driver 420, comparator 430, and output capacitance represented by capacitor 440. Voltage reference circuit 410 can be programmable to select a desired voltage for the output high level of the output voltage. Capacitor 440 can be a capacitive load and/or energy storage device. Output driver 420 includes switches 421, 422, and 423. In an embodiment, switches 421 and 422 are PMOS transistors, and switch 423 is a “native” NMOS transistor. Native NMOS typically has a threshold voltage that approaches 0 volts, and conducts current until the voltage difference between gate and source becomes 0 volts. Each transistor has a gate for the control terminal and a source and drain as non-control terminals.

The output of voltage reference circuit 410 is coupled to the control terminal of switch 423 and an inverting input of comparator 430. The output voltage of output driver 420 (at the second non-control terminal of switch 423) is coupled to a non-inverting input of comparator 430. The output of comparator 430 is coupled to a control terminal of switch 422 (in output driver 420). Switch 422 has a first non-control terminal coupled to first non-control terminal of switch 423 and a second non-control terminal coupled to a second non-control terminal of switch 421. Switch 421 has a control terminal that is coupled to a power down signal. The first non-control terminal of switch 421 is coupled to a power supply. The second non-control terminal of switch 423 is coupled to a transmission line and optionally to a first terminal of the capacitor 440. A second terminal of capacitor 440 is coupled to ground.

In operation, output driver 400 uses the reference voltage signal to limit the output high voltage. The power down signal can be used to drive the gate of switch 421. When switch 422 is closed (conducting), the driver output signal is driven in response to the power down signal.

The reference voltage signal is compared with the driver output signal of output driver 420 so that an output high voltage control signal is generated. When the output voltage transitions from low to high, (native NMOS) switch 423 serves as an analog switch, which lessens the slew rate of the output voltage during the early ramp-up stage. The lower slew rate provides additional stability because of the relatively slow feedback loop provided through comparator 430.

When the driver output signal voltage reaches the reference voltage signal (when both switches 422 and 421 are closed), the output high voltage control signal turns off the current path of output driver 420 by opening switch 422. The transmission line and/or capacitor 440 provide a substantially large load capacitance that allows comparator 430 to respond quickly enough to turn off the current path so that feedback path is stabilized. As discussed above, the load capacitance normally includes the capacitance of structures (parasitic or otherwise) in the transmission path of the output voltage. Switch 422 and/or switch 421 can be opened to conserve power for a power-down mode.

Figure 5:
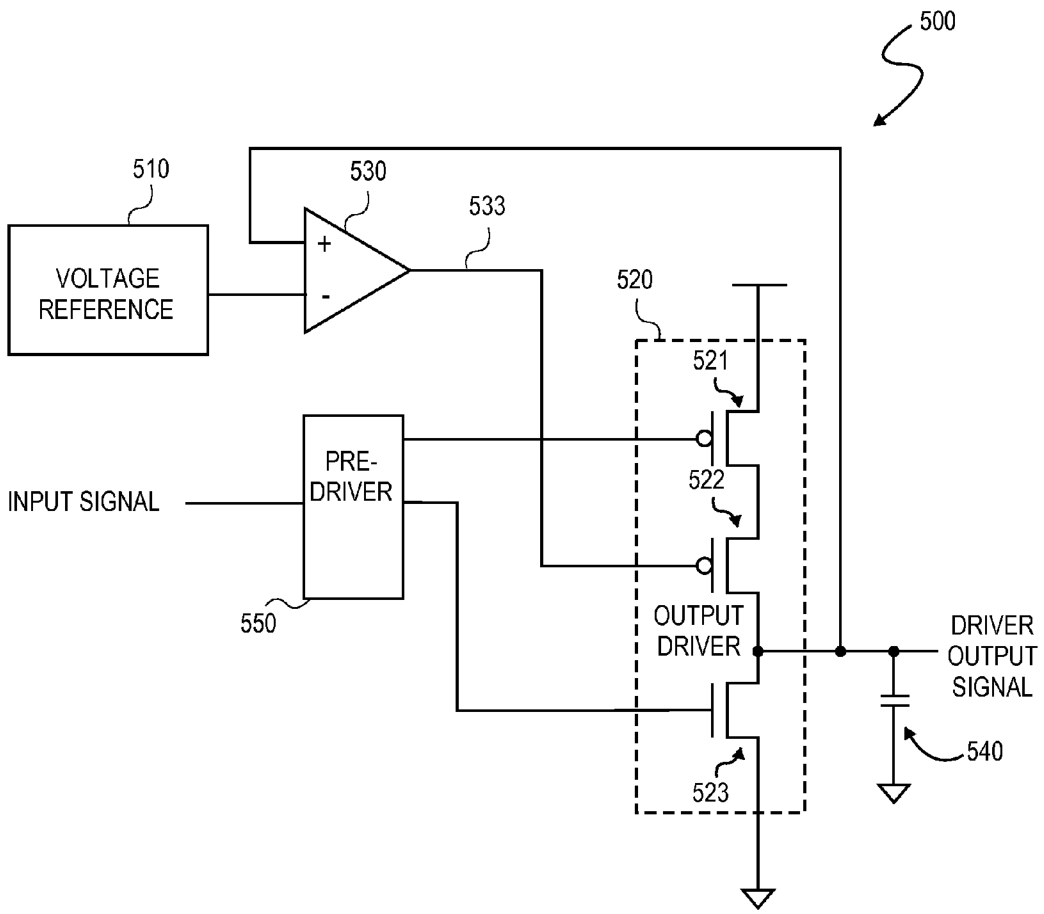
FIG. 5 is an illustration of a sample output driver having capacitive stabilization and a predriver circuit.

FIG. 5 is an illustration of a sample output driver having capacitive stabilization and an input signal. Output driver 500 includes a voltage reference circuit 510, output driver 520, comparator 530, capacitor 540, and pre-driver 550. Voltage reference circuit 510 can be programmable to select a desired voltage for the output high level of the output signal. Capacitor 540 can be a capacitive load and/or energy storage device. Output driver 520 includes switches 521, 522, and 523. In an embodiment, switches 521 and 522 are PMOS transistors, and switch 523 is an NMOS transistor. Each transistor has a gate for the control terminal and a source and drain as non-control terminals.

The output of voltage reference circuit 510 is coupled to an inverting input of comparator 530. The non-inverting input of comparator 530 is coupled to the output of output driver 520 (at the second non-control terminal of switch 522). The output of comparator 530 is coupled to a control terminal of switch 522. An input signal is applied to an input of pre-driver 550. A first output of pre-driver 550 is coupled to a control terminal of switch 521 and a second output of pre-driver 550 is coupled to a control terminal of switch 523.

Switch 521 has a first non-control terminal coupled to a power supply and a second non-control terminal coupled to a first non-control terminal of switch 522. Switch 522 has a second non-control terminal that is coupled to a first non-control terminal of switch 523, which is the output of output driver 520, and is further coupled to a first terminal of the capacitor 540. A second terminal of capacitor 540 is coupled to ground.

In operation, output driver 500 uses the reference voltage signal to limit the output high voltage of output driver 520. The input signal is inverted to two identical outputs by the pre-driver 550 and can be used to drive the control terminals of switch 521 and switch 523. When switch 522 is closed (conducting), the driver output signal is driven in response to the input signal. Switch 521 is used to couple the power supply to the driver output signal in response to a high state of the input signal.

The reference voltage signal is compared with the driver output signal of output driver 520 so that an output high voltage control signal is generated. When the driver output signal reaches the reference voltage signal (when both switches 522 and 521 are closed and switch 523 is open), the output high voltage control signal turns off the current path of output driver 520 by opening switch 522. The transmission line and/or capacitor 540 provide a substantially large load capacitance that allows comparator 530 to respond quickly enough (with respect to the feedback loop response time) to turn off the current path so that feedback path is stabilized. As discussed above, the load capacitance normally includes the capacitance of structures in the transmission path of the output signal. Switch 522 and/or switch 521 can be opened to conserve power for a power-down mode.

Figure 6:
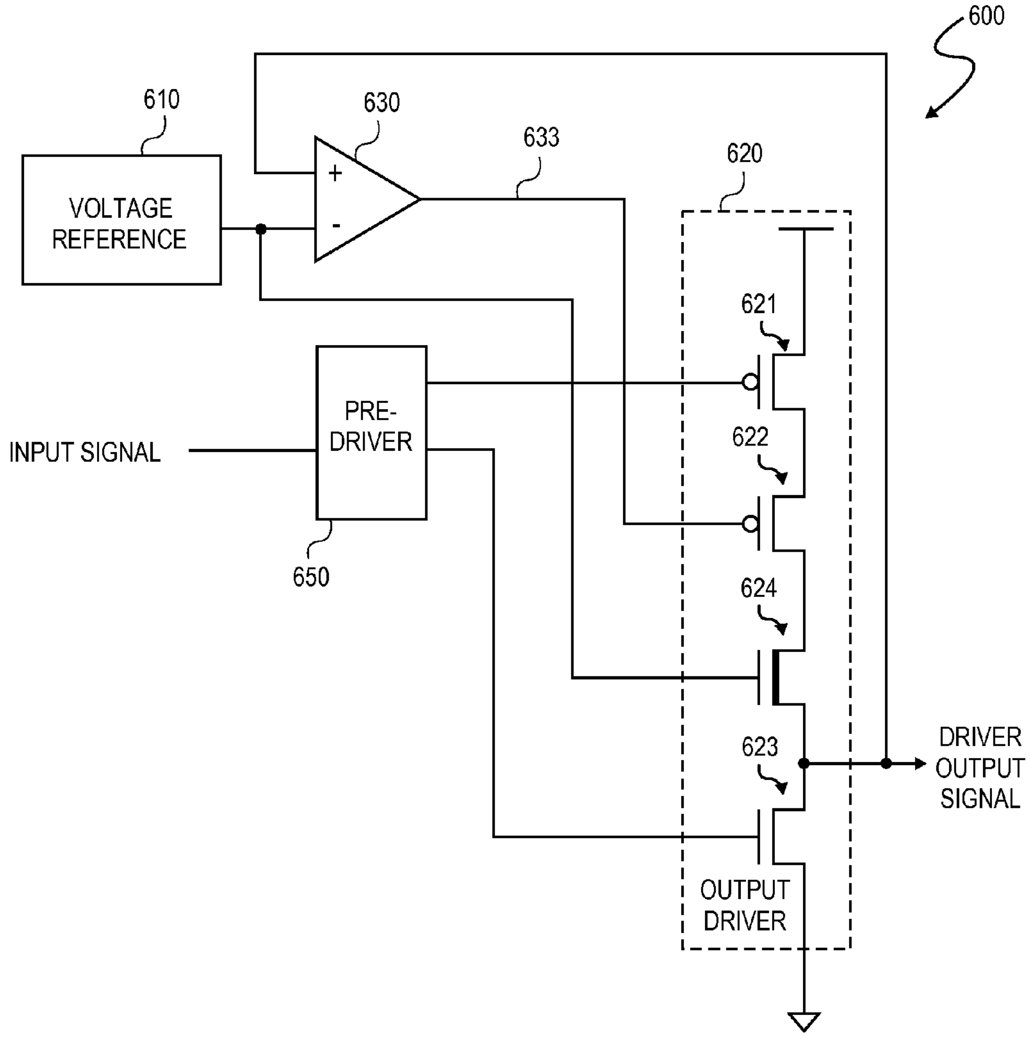
FIG. 6 is an illustration of a sample output driver having a predriver circuit and stabilization using a native NMOS/NMOS transistor.

FIG. 6 is an illustration of a sample output driver having a differential input signal and stabilization using an analog switch. Output driver 600 includes a voltage reference circuit 610, output driver 620, comparator 630, and pre-driver 650. Voltage reference circuit 610 can be programmable to select a desired voltage for the output high level of the output signal. Output driver 620 includes switches 621, 622, 623, and 624. In an embodiment, switches 621 and 622 are PMOS transistors, switch 623 is an NMOS transistor, and switch 624 is a native NMOS transistor. Each transistor has a gate for the control terminal and a source and drain as non-control terminals.

The output of voltage reference circuit 610 is coupled to an inverting input of comparator 630 and the gate of switch 624. The non-inverting input of comparator 630 is coupled to the output of output driver 620. The output of comparator 630 is coupled to a control terminal of switch 622 (in output driver 620). An input signal is applied to an input of pre-driver 650. A first output of pre-driver 650 is coupled to a control terminal of switch 621 and a second output of pre-driver 650 is coupled to a control terminal of switch 623. The output signal of output driver 620 is coupled to a non-inverting input of comparator 630.

Switch 621 has a first non-control terminal coupled to a power supply and a second non-control terminal coupled to a first non-control terminal of switch 622. Switch 622 has a second non-control terminal that is coupled to a first non-control terminal of switch 624. Switch 624 has a second non-control terminal (which is the output of output driver 620) that is coupled to a first non-control terminal of switch 623.

In operation, output driver 600 uses the reference voltage signal to limit the output high voltage. The input signal is inverted to two identical outputs by the pre-driver 650 and can be used to drive the gates of switch 621 and switch 623. When switch 622 is closed (conducting), the driver output signal is driven in response to the input signal. Switch 621 is used to couple the power supply to the driver output signal in response to a high state of the input signal.

The reference voltage signal is compared with the driver output signal of output driver 620 so that an output high voltage control signal is generated. When the output voltage transitions from low to high, (native NMOS) switch 624 serves as an analog switch, which lessens the slew rate of the output voltage during the early ramp-up stage. The lower slew rate provides additional stability because of the relatively slow feedback loop provided through comparator 630.

When the driver output signal reaches the reference voltage signal (when both switches 622 and 621 are closed and switch 623 is open), the output high voltage control signal turns off the current path of output driver 620 by opening switch 622. As discussed above, the load capacitance of the transmission line affects the slew rate of the output voltage and affects stability of the feedback loop produced by comparator 630. Switch 622 and/or switch 621 can be opened to conserve power for a power-down mode.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A driver circuit, comprising:
- a voltage reference circuit to generate a voltage reference signal;
- a pre-driver coupled to receive an input signal and to generate first and second pre-driver output signals in response to the input signal; and
- an output driver to generate a driver output signal, the output driver including:
  - a first switch having a first control terminal coupled to receive the first pre-driver output signal;
  - a second switch having a second control terminal coupled to receive the second pre-driver output signal;
  - a native mode transistor coupled in series between the first switch and the second switch having a third control terminal coupled to receive the voltage reference signal; and
  - a driver output coupled between the native mode transistor and the second switch to output the driver output signal.

2. The driver circuit of claim 1, wherein the first switch comprises a PMOS transistor, the second switch comprises an NMOS transistor, and the native mode transistor comprises an NMOS native mode transistor.

3. The driver circuit of claim 2, further comprising an output capacitor coupled between ground and the driver output.

4. The driver circuit of claim 3, wherein the capacitor is external to a substrate that comprises the output driver and has a capacitance that is 0.1 μF or greater.

5. The driver circuit of claim 2, wherein the first switch is coupled between a source voltage and the native mode transistor and the second switch is coupled between a ground voltage and the driver output.

6. The driver circuit of claim 1, wherein the pre-driver inverts the input signal to generate the first and second pre-driver output signals as substantially identical signals.

7. The driver circuit of claim 1, further comprising:
- a circuit, other than the output driver, coupled between the driver output and the first control terminal of the first switch.

8. The driver circuit of claim 7, wherein the circuit comprises a feedback circuit.

9. The driver circuit of claim 8, further comprising a third switch coupled in series between the first switch and the native mode transistor, wherein the feedback circuit comprises:
- a feedback path coupled to the driver output; and
- a comparator including:
  - a first comparator input coupled to the feedback path;
  - a second comparator input coupled to receive the voltage reference signal; and
  - a comparator output coupled to a third control terminal of the third switch.

10. The driver circuit of claim 1, wherein the input signal comprises a power down signal.

11. An apparatus, comprising:
- a pre-driver coupled to receive an input signal and to generate first and second pre-driver output signals in response to the input signal; and
- an output driver to generate a driver output signal, the output driver including:
  - a PMOS transistor having a first control terminal coupled to receive the first pre-driver output signal;
  - a NMOS transistor having a second control terminal coupled to receive the second pre-driver output signal;
  - a native mode NMOS transistor coupled in series between the PMOS transistor and the NMOS transistor having a third control terminal coupled to receive a voltage reference signal; and
  - a driver output coupled between the native mode NMOS transistor and the NMOS transistor to output the driver output signal.

12. The apparatus of claim 11, further comprising:
- a voltage reference circuit to generate the voltage reference signal.

13. The driver circuit of claim 11, further comprising an output capacitor coupled between ground and the driver output.

14. The driver circuit of claim 13, wherein the capacitor is external to a substrate that comprises the output driver and has a capacitance that is 0.1μF or greater.

15. The driver circuit of claim 11, wherein the PMOS transistor is coupled between a source voltage and the native mode NMOS transistor and the NMOS transistor is coupled between a ground voltage and the driver output.

16. The driver circuit of claim 11, wherein the pre-driver inverts the input signal to generate the first and second pre-driver output signals as substantially identical signals.

17. The driver circuit of claim 11, further comprising:
- a circuit coupled between the driver output and the first control terminal of the PMOS transistor.

18. The driver circuit of claim 17, wherein the circuit comprises a feedback circuit.

19. The driver circuit of claim 18, further comprising another PMOS transistor coupled in series between the PMOS transistor and the native mode NMOS transistor, wherein the feedback circuit comprises:

a feedback path coupled to the driver output; and a comparator including:

a first comparator input coupled to the feedback path;

a second comparator input coupled to receive the voltage reference signal; and a comparator output coupled to a third control terminal of the other PMOS transistor.

* * * * *